(12) United States Patent  
Chen et al.

(10) Patent No.: US 10,291,189 B2  
(45) Date of Patent: May 14, 2019

(54) AMPLIFICATION CIRCUIT

(71) Applicant: RICHWAVE TECHNOLOGY CORP., Taipei (TW)

(72) Inventors: Chih-Sheng Chen, Taipei (TW); Chia-Jung Yeh, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 15/730,241

(22) Filed: Oct. 11, 2017

(65) Prior Publication Data

US 2018/0191313 A1    Jul. 5, 2018

(30) Foreign Application Priority Data

Dec. 30, 2016  (TW) .............................. 105144293 A (51) Int. Cl.
| | | |
|---|---|---|
| *H03F 1/14* | (2006.01) | |
| *H03F 1/00* | (2006.01) | |
| *H03F 3/19* | (2006.01) | |
| *H03F 3/21* | (2006.01) | |

(52) U.S. Cl.
CPC .............. *H03F 3/19* (2013.01); *H03F 3/211* (2013.01); *H03F 2203/21131* (2013.01)

(58) Field of Classification Search
CPC ... H03F 3/19; H03F 3/211; H03F 2203/21131
USPC .................. 330/51, 151, 133, 150, 310, 296
See application file for complete search history.

(56) References Cited

U.S. PATENT DOCUMENTS

| | | | |
|---|---|---|---|
| 5,099,154 A | 3/1992 | Lagoni et al. | |
| 5,541,554 A | 7/1996 | Stengel et al. | |
| 6,137,354 A * | 10/2000 | Dacus ................... | H03F 1/0255 330/151 |
| 6,967,528 B2 * | 11/2005 | Takagi .................... | H03F 1/342 330/277 |
| 2012/0249191 A1 | 10/2012 | Marie et al. | |

FOREIGN PATENT DOCUMENTS

CA          2690442 A1       7/2011

* cited by examiner

*Primary Examiner* — Khanh V Nguyen  
*Assistant Examiner* — Khiem D Nguyen  
(74) *Attorney, Agent, or Firm* — Winston Hsu (57) ABSTRACT

An amplification circuit includes a first amplifier circuit and a second-stage amplifier. The second-stage amplifier is connected to the amplifier to form a multi-stage amplification circuit. The first amplifier circuit includes a first-stage amplifier and a bypass circuit. The bypass circuit includes a first transistor. A first end of the first transistor is coupled to the input end of the first amplifier circuit, a second end of the first transistor is coupled to the output end of the first amplifier circuit, and a third end of the first transistor is coupled to a supply voltage. The first end of the first transistor is further coupled to a first control terminal to receive a control signal for controlling a bias voltage of the first transistor, so as to make the amplification circuit work in different operation modes.

19 Claims, 5 Drawing Sheets

AMPLIFICATION CIRCUIT

CROSS-REFERENCE TO RELATED APPLICATION

This application claims priority of Taiwan application No. 105144293, which was filed on Dec. 30, 2016, and is included herein by reference.

TECHNICAL FIELD

The present disclosure relates to an amplification circuit; in particular, to an amplification circuit that modulates signals in different operation modes.

BACKGROUND

The power amplifier is one of the essential elements in an RF transmission circuit. The power amplifier is configured to amplify signals before they are transmitted. Thus, the power amplifier is usually configured at the front of an antenna transmitter. However, the power amplifier is one of the elements that consume lots of power in the RF transmission circuit. Currently, the power amplifier used in many smart devices (such as, a smart phone, a tablet, and the like) is mainly made of GaAs. Due to the characteristics of having high frequency and insulation, less power consumption, and the weak absorptivity of noises and harmonic waves, GaAs devices can be applied in current 4G signal transmission and may even see application in future 5G signal transmission.

SUMMARY

The present disclosure provides an amplification circuit used to modulate signals in different operation modes. This amplification circuit includes a first amplifier circuit and a second-stage amplifier, and the second-stage amplifier is connected to the first amplifier circuit to form a multi-stage amplification circuit. The first amplifier circuit includes a first-stage amplifier and a bypass circuit. The first-stage amplifier has an input end and an output end. The bypass circuit includes a first transistor. A first end of the first transistor is coupled to the input end of the first-stage amplifier, a second end of the first transistor is coupled to the output end of the first-stage amplifier, and a third end of the first transistor is configured for coupling to a supply voltage. The first end of the first transistor is further coupled to a first control terminal, and a control signal is transmitted from the first control terminal to control a bias voltage of the first transistor for switching the operation mode of the amplification circuit.

The present disclosure further provides an amplification circuit, and this amplification circuit includes an amplifier and a bypass circuit. The amplifier has an input end and an output end. The bypass circuit includes a first transistor. A first end of the first transistor is coupled to the input end of the amplifier, a second end of the first transistor is coupled to the output end of the amplifier, and a third end of the first transistor is coupled to a supply voltage. The first end of the first transistor is further configured for coupling to a control terminal, and a control signal is transmitted from the control terminal to control the bias voltage of the first transistor.

For further understanding of the present disclosure, reference is made to the following detailed description illustrating the embodiments of the present disclosure. The description is only for illustrating the present disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

The aforementioned illustrations and following detailed descriptions are exemplary for the purpose of further explaining the scope of the present disclosure. Other objectives and advantages related to the present disclosure will be illustrated in the subsequent descriptions and appended drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

[One Embodiment of the Amplification Circuit]

Figure 1:
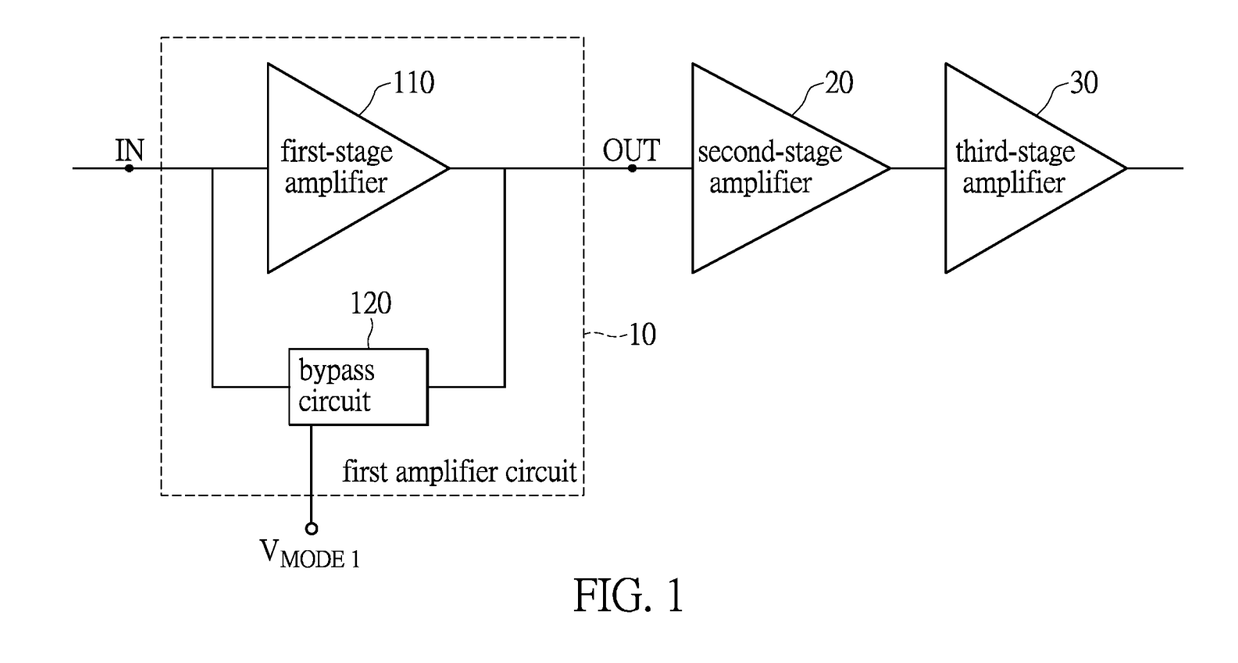
FIG. 1 shows a block diagram of an amplification circuit according to one embodiment of the present disclosure.

Referring to FIG. 1, a block diagram of an amplification circuit of one embodiment of the present disclosure is shown. The amplification circuit in this embodiment at least includes a first amplifier circuit 10 and a second-stage amplifier 20. For the ease of illustration, a three-stage amplification circuit is taken as an example of the amplification circuit in this embodiment in the following description. As shown in FIG. 1, the second-stage amplifier 20 is connected to the first amplifier circuit 10, and the third-stage amplifier 30 is connected to the second-stage amplifier 20 to form a three-stage amplification circuit.

The first amplifier circuit 10 includes a first-stage amplifier 110 and a bypass circuit 120 that is connected to the first-stage amplifier 110 in parallel. The feature of the present disclosure is that, the bypass circuit 120 can be controlled by the first control terminal $V_{MODE1}$ such that the amplification circuit can work in different operation modes. For example, the amplification circuit can be a Dual Mode amplification circuit that can work in a Linear Mode or a Non-Linear Mode. In this example, the bypass circuit 120 can be controlled by the control terminal $V_{MODE1}$ such that the amplification circuit can work as a two-stage amplification circuit or a three-stage amplification circuit. Therefore, the two-stage amplification circuit could work in a linear mode and the three-stage amplification circuit could work in a non-linear mode.

In FIG. 1, the first amplifier circuit 10, the second-stage amplifier 20 and the third-stage amplifier 30 form a three-stage amplification circuit, and more specifically, this three-stage amplification circuit is a power amplification circuit, with the first-stage amplifier 110 in the first amplifier circuit 10 being a first-stage driver amplifier, the second-stage amplifier 20 being a second-stage driver amplifier, and the third-stage amplifier 30 being a third-stage power amplifier.

In the following description, the working principle of the amplification circuit in this embodiment is illustrated.

Figure 2:
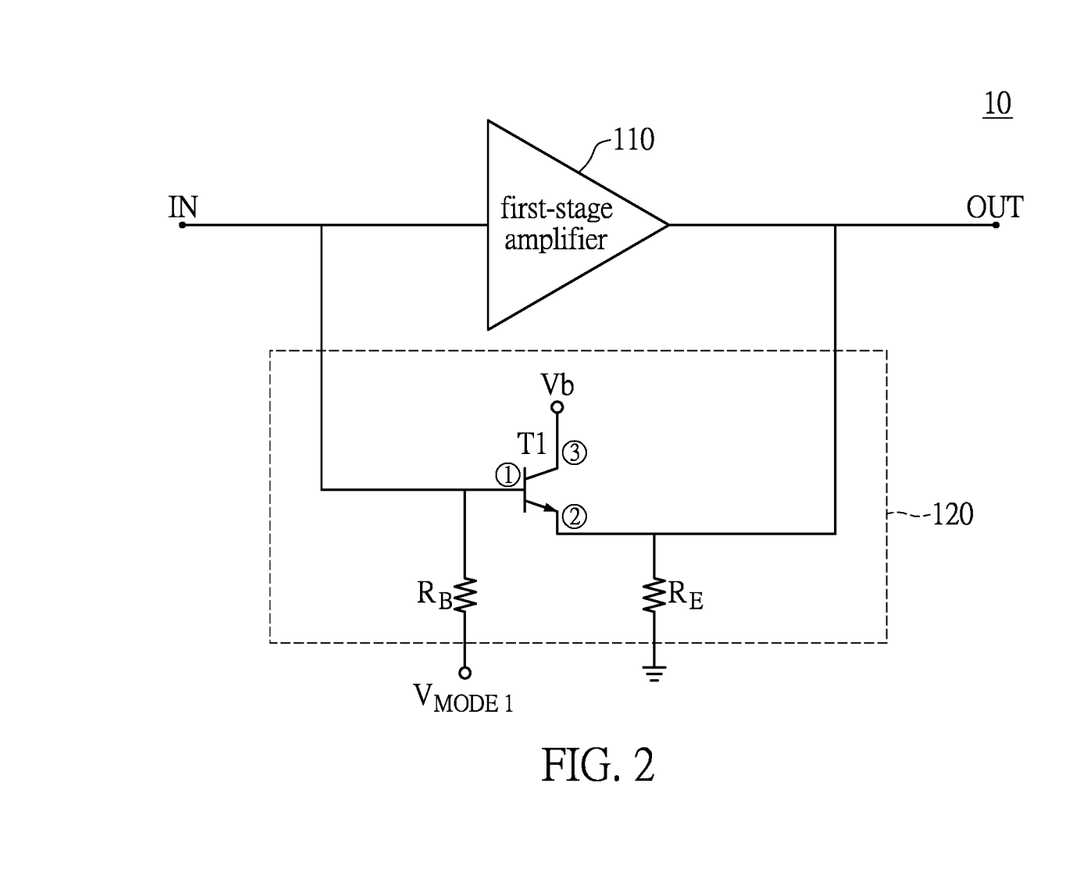
FIG. 2 shows a circuit diagram of an amplification circuit according to one embodiment of the present disclosure.

Referring to FIG. 2, a circuit diagram of an amplification circuit of one embodiment of the present disclosure is shown. The configuration of the bypass circuit 120 in the amplification circuit is provided by FIG. 2. The first-stage amplifier 110 has an input end IN and an output end OUT. A signal to be amplified (e.g. a RF signal) is received by the input end IN of the first-stage amplifier 110, and an amplified signal or a modulated signal is transmitted from the output end OUT of the first-stage amplifier 110. In addition, the bypass circuit 120 includes a first transistor T1. A first end of the first transistor T1 (marked by ① in FIG. 2) is coupled to the input end IN of the first-stage amplifier 110, a second end of the first transistor T1 (marked by ② in FIG. 2) is coupled to the output end OUT of the first-stage amplifier 110, and a third end of the first transistor T1 (marked by ③ in FIG. 2) is coupled to a supply voltage Vb.

The first end of the first transistor T1 is further coupled to a first control terminal $V_{MODE1}$. The first transistor T1 receives a control signal from the first control terminal $V_{MODE1}$ to control the bias voltage of the first transistor T1, such that the amplification circuit can work in different operation modes. In this embodiment, the first transistor T1 can be considered a switch, and the control signal can be considered a control voltage. In another embodiment, the control signal can be considered a control current. When the first transistor T1 is turned off, the bypass circuit 120 is an open circuit and the first-stage amplification circuit 110 is enabled. In this case, the signal is amplified or modulated by the first-stage amplifier 110 and then is transmitted to the output end OUT of the first-stage amplifier 110. At this time, the amplification circuit in FIG. 2 is a three-stage amplification circuit that works in a non-linear mode. On the other hand, when the first transistor T1 is turned on, compared with the first-stage amplifier 110, the equivalent resistance of the bypass circuit 120 is small and the first-stage amplification circuit 110 is disabled or turned off. In this case, the signal is directly transmitted to the output end OUT of the first-stage amplifier 110 through the bypass circuit 120, instead of being amplified or modulated by the first-stage amplification circuit 110. Thus, the amplification circuit in FIG. 2 is a two-stage amplification circuit that works in a linear mode.

The bypass circuit 120 further includes a bias circuit, and this bias circuit at least includes a first bias resistor RB. One end of the first bias resistor RB is coupled to the first end of the first transistor T1, and another end of the first bias resistor RB is coupled to the first control terminal $V_{MODE1}$. The bypass circuit 120 also includes a second bias resistor RE. One end of the second bias resistor RE is coupled to the second end of the first transistor T1, and another end of the second bias resistor RE is coupled to a reference voltage or is grounded to make the working voltage of the first transistor T1 stable.

As described above, the first transistor T1 can be considered a switch. For example, the first transistor T1 can be a bipolar junction transistor. The first end of the first transistor T1 is a base, the second end of the first transistor T1 is an emitter, and the third end of the first transistor T1 is a collector. According to FIG. 2, the first transistor T1 in the bypass circuit 120 works as an emitter follower. The output voltage at the emitter of an emitter follower varies with the input voltage of the emitter follower, and a signal output from the emitter of the emitter follower and an input signal of the emitter follower have the same phase. Thus, the bypass circuit 120 can perform with a great linearity even when working under a high power condition. Due to the same reason, the elements in the power amplification circuit can be mainly made of GaAs.

In this example, under the control of the control signal from the first control terminal $V_{MODE1}$, when the bias voltage of the first transistor T1 is within a cutoff region of the first transistor T1, the first transistor T1 is turned off such that the amplification circuit in FIG. 2 is a three-stage amplification circuit that works in a non-linear mode. On the other hand, when the bias voltage of the first transistor T1 is within an active region of the first transistor T1, the first transistor T1 is turned on such that the amplification circuit in FIG. 2 is a two-stage amplification circuit that works in a linear mode.

In the following description, other embodiments of the bypass circuit 120 are provided. For ease of illustration, in other figures, the first end, the second end and the third end of each transistor are respectively marked by ①, ② and ③.

Figure 3A:
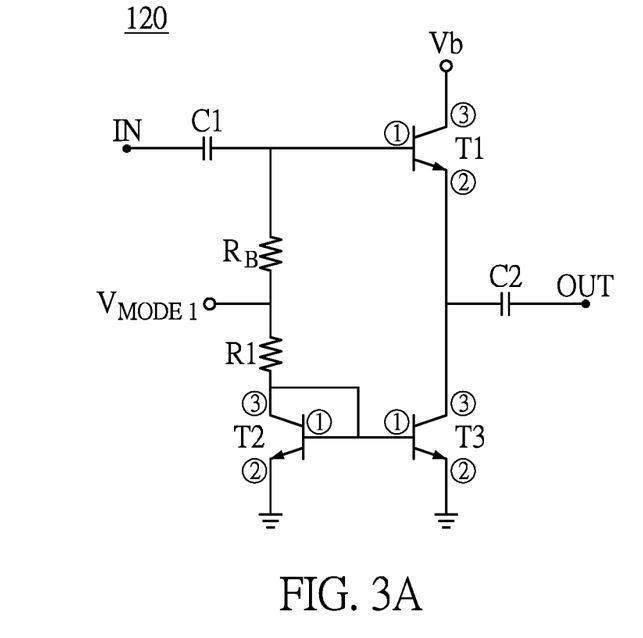
FIG. 3A shows a circuit diagram of a bypass circuit of the amplification circuit according to one embodiment of the present disclosure.

Referring to FIG. 3A, a circuit diagram of a bypass circuit of the amplification circuit of one embodiment of the present disclosure is shown. To make the amplification circuit in this embodiment work normally even in a non-linear mode, the bypass circuit 120 has a configuration as shown in FIG. 3A.

Different from the bypass circuit 120 shown in FIG. 2, the bypass circuit 120 shown in FIG. 3A further includes a second transistor T2, a third transistor T3, a first resistor R1, a first capacitor C1 and a second capacitor C2. The first capacitor C1 is coupled between the first end of the first transistor T1 and the input end of the first-stage amplifier 110, and the second capacitor C2 is coupled between the second end of the first transistor T1 and the output end of the first-stage amplifier 110. A first end of the second transistor T2 is coupled to a first end of the third transistor T3, and a third end of the second transistor T2 is coupled between the first bias resistor RB and the first control terminal $V_{MODE1}$ through the first resistor R1. In addition, a third end of the third transistor T3 is coupled between the second end of the first transistor T1 and the second capacitor C2, the first end of the second transistor T2 and the third end of the second transistor T2 are coupled together, and the second end of the second transistor T2 and the second end of the third transistor T3 are both coupled to a reference voltage or are both grounded. It should be noted that, the second transistor T2 and the third transistor T3 are both bipolar junction transistors. The first ends of the second transistor T2 and the third transistor T3 are bases, the second ends of the second transistor T2 and the third transistor T3 are emitters, and the third ends of the second transistor T2 and the third transistor T3 are collectors.

The circuit formed by the second transistor T2 and the third transistor T3 in the bypass circuit 120 is similar to a current mirror, so that the equivalent resistance of the bypass circuit 120 is rather large with respect to the output end OUT of the first-stage amplifier 110. Therefore, the amplification circuit can normally work in a non-linear mode and is hardly affected by the bypass circuit 120.

However, for a bipolar junction transistor, the size of the depletion region changes with a variation of the collector-emitter voltage, which is called the Early Effect. Due to the Early Effect, the current flowing through the second transistor T2 is not equal to the current flowing output from the output end OUT of the first-stage amplifier 110. To reduce the Early Effect, the bypass circuit 120 could be designed as a configuration shown in FIG. 3B.

Figure 3B:
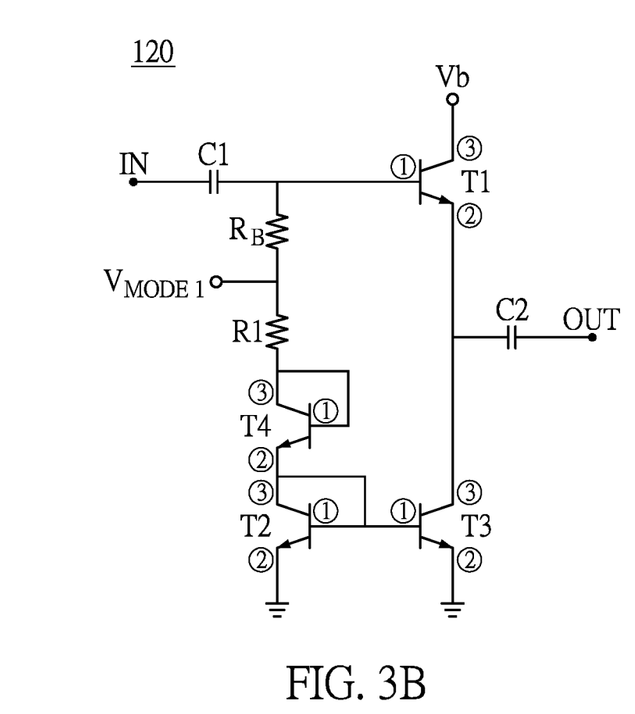
FIG. 3B shows a circuit diagram of a bypass circuit of the amplification circuit according to another embodiment of the present disclosure.

Compared with the bypass circuit 120 shown in FIG. 3A, the bypass circuit 120 shown in FIG. 3B further includes a fourth transistor T4. A first end of the fourth transistor T4 and a third end of the fourth transistor T4 are coupled together, and further coupled between the first bias resistor RB and the first control terminal $V_{MODE1}$ through the first resistor R1. In addition, a second end of the fourth transistor T4 is coupled to the first end of the second transistor T2 and the third end of the second transistor T2. It should be noted that, the fourth transistor T4 is a bipolar junction transistor, the first end of the bipolar junction transistor is a base, the second end of the bipolar junction transistor is an emitter, and the third end of the bipolar junction transistor is a collector.

An additional voltage drop is provided by the fourth transistor T4 so that the current flowing output from the output end OUT of the first-stage amplifier 110 can be proportional to the current flowing through the second transistor T2, and thus the Early Effect can be reduced.

However, when the amplification circuit is working, the supply voltage Vb, such as a voltage supplied by a battery, gradually decreases. Thus, the supply voltage Vb may not be able to afford the additional voltage drop for turning on the fourth transistor T4. In this case, the bypass circuit 120 shown in FIG. 3B may not normally work. To avoid the Early Effect and to make sure that the bypass circuit 120 can normally work, the bypass circuit 120 could be designed as a configuration shown in FIG. 4.

Figure 4:
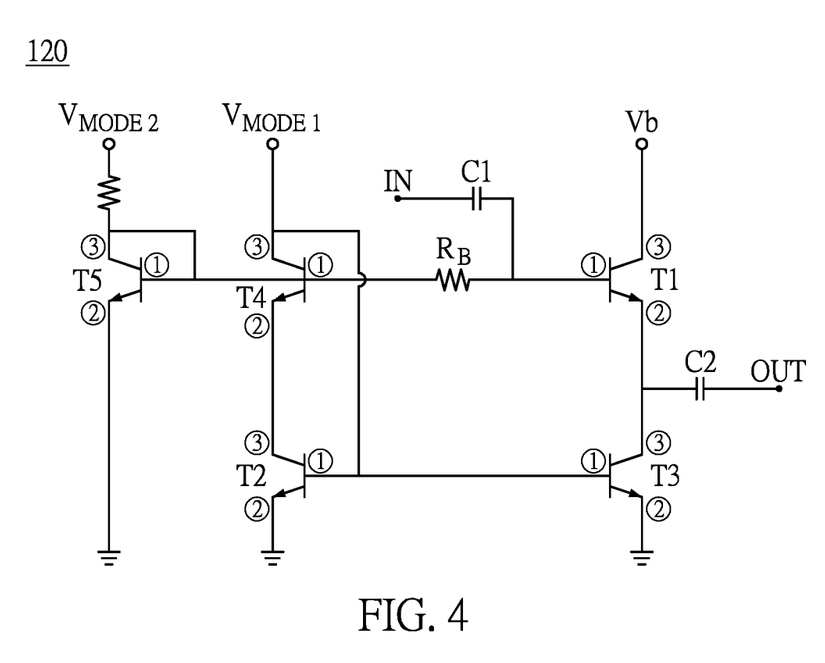
FIG. 4 shows a circuit diagram of a bypass circuit of the amplification circuit according to still another embodiment of the present disclosure.

Compared with the bypass circuit 120 shown in FIG. 2, the bypass circuit 120 shown in FIG. 4 further includes a second transistor T2, a third transistor T3, a fourth transistor T4, a fifth transistor T5, a first capacitor C1 and a second capacitor C2. As shown in FIG. 4, the first capacitor C1 is coupled between the first end of the first transistor T1 and the input end IN of the first-stage amplifier 110, and the second capacitor C2 is coupled between the second end of the first transistor T1 and the output end OUT of the first-stage amplifier 110. A first end of the second transistor T2 and a first end of the third transistor T3 are coupled together. A third end of the third transistor T3 is coupled between the second end of the first transistor T1 and the second capacitor C2. A second end of the second transistor T2 and a second end of the third transistor T3 are both coupled to a reference voltage or are both grounded. In addition, a first end of the fourth transistor T4 is coupled to the first end of the first transistor T1 and the first capacitor C1 through the first bias resistor RB, a second end of the fourth transistor T4 is coupled to the third end of the second transistor T2, and a third end of the fourth transistor T4 is coupled to the first end of the second transistor T2. Moreover, a first end of the fifth transistor T5 and a third end of the fifth transistor T5 are coupled together, and further coupled to the first end of the fourth transistor T4. The third end of the fourth transistor T4 is coupled to the first control terminal $V_{MODE1}$, and the third end of the fifth transistor T5 is coupled to a second control terminal $V_{MODE2}$, to receive control signal respectively from the first control terminal $V_{MODE1}$ and the second control terminal $V_{MODE2}$.

It should be noted that, the second transistor T2, the third transistor T3, the fourth transistor T4 and the fifth transistor T5 are all bipolar junction transistors. The first ends of the second transistor T2, the third transistor T3, the fourth transistor T4 and the fifth transistor T5 are bases, the second ends of the second transistor T2, the third transistor T3, the fourth transistor T4 and the fifth transistor T5 are emitters, and the third ends of second transistor T2, the third transistor T3, the fourth transistor T4 and the fifth transistor T5 are collectors. Additionally, in another embodiment, the first control terminal $V_{MODE1}$ and the second control terminal $V_{MODE2}$ are the same control terminal.

In the bypass circuit 120 shown in FIG. 4, under the circumstance that there is no fifth transistor T5, the first end of the fourth transistor T4 and the second end of the fourth transistor T4 are coupled together, and the first end of the second transistor T2 and the second end of the second transistor T2 are coupled together, the voltage at the second end of the fourth transistor T4 could be larger than at least two times of the threshold voltage of a transistor. However, for the bypass circuit 120 shown in FIG. 4, the voltage at the second end of the fourth transistor T4 merely needs to be larger than one threshold voltage of a transistor. Therefore, even if the supply voltage Vb gradually decreases when the amplification circuit is working, the bypass circuit 120 can still work normally.

It is worth mentioning that, in all of the above embodiments, the first transistor T1, the second transistor T2, the third transistor T3, the fourth transistor T4 and the fifth transistor T5 can be all replaced by FETs. In this case, the first ends of the first transistor T1, the second transistor T2, the third transistor T3, the fourth transistor T4 and the fifth transistor T5 are gates, the second ends of the first transistor T1, the second transistor T2, the third transistor T3, the fourth transistor T4 and the fifth transistor T5 are sources, and the third end of the first transistor T1, the second transistor T2, the third transistor T3, the fourth transistor T4 and the fifth transistor T5 are drains. In another embodiment, the FET can be considered a MOSFET.

When the first transistor T1, the second transistor T2, the third transistor T3, the fourth transistor T4 and the fifth transistor T5 are all FETs, the first transistor T1 in the bypass circuit 120 works as a source follower. Therefore, the voltage gain of the source follower is about 1, so that the bypass circuit 120 can perform with a great linearity even when working in a high power condition. Due to the same reason, the elements in the power amplification circuit can be mainly made of GaAs.

[Another Embodiment of the Amplification Circuit]

Figure 5:
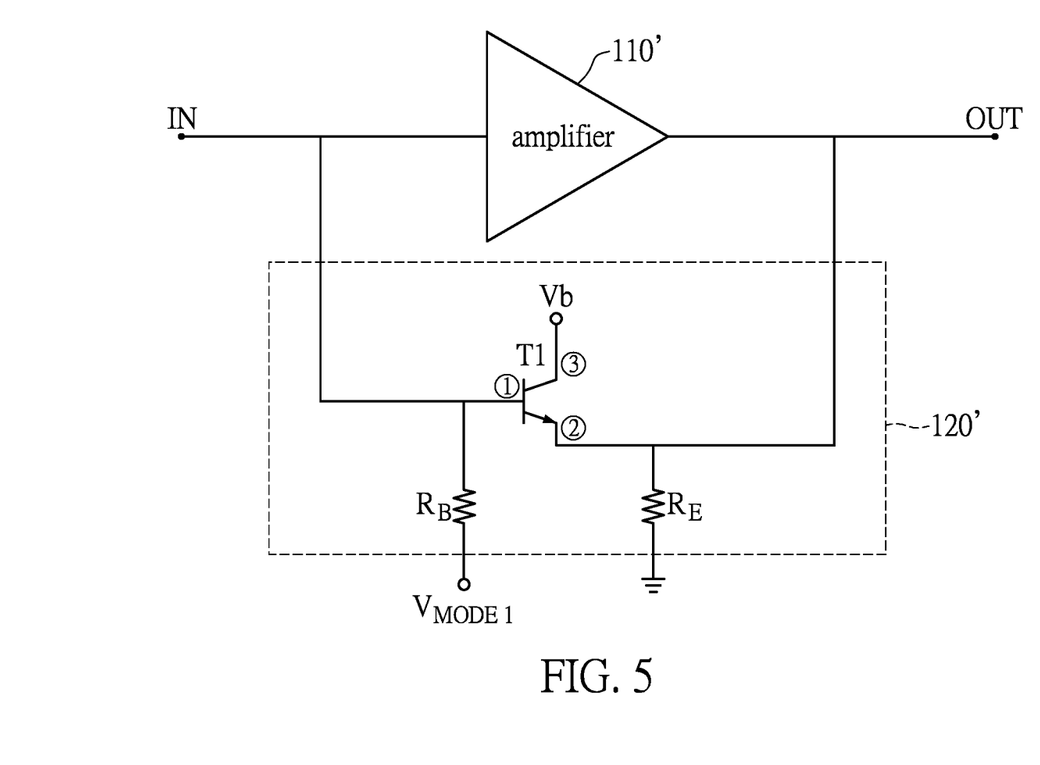
FIG. 5 shows a circuit diagram of an amplification circuit according to another embodiment of the present disclosure.

Referring to FIG. 5, a circuit diagram of an amplification circuit of another embodiment of the present disclosure is shown. The amplification circuit in this embodiment mainly includes an amplifier 110' and a bypass circuit 120'.

The amplifier 110' has an input end IN and an output end OUT. A signal to be amplified (e.g. a RF signal) is received by the input end IN of the first-stage amplifier 110', and an amplified signal or a modulated signal is transmitted from the output end OUT of the first-stage amplifier 110'. In addition, the bypass circuit 120' includes a first transistor T1. A first end of the first transistor T1 is coupled to the input end IN of the amplifier 110', a second end of the first transistor T1 is coupled to the output end OUT of the amplifier 110', and the third end of the first transistor T1 is coupled to a supply voltage Vb. The first end of the first transistor T1 is further coupled to a control terminal $V_{MODE1}$ to receive a control signal for controlling the bias voltage of the first transistor T1.

It should be noted that, the amplification circuit in this embodiment is a power amplification circuit, and the amplifier 110' is a driver amplifier.

The bypass circuit 120' includes a bias circuit. As shown in FIG. 5, the bias circuit 120' at least includes a first bias resistor RB. One end of the first bias resistor RB is coupled to the first end of the first transistor T1, and another end of the first bias resistor RB is coupled to the control terminal $V_{MODE1}$. In addition, the bypass circuit 120' further includes a second bias resistor RE. One end of the second bias resistor RE is coupled to the second end of the first transistor T1, and another end of the second bias resistor RE is coupled to a reference voltage or is grounded to stabilize the working voltage of the first transistor T1.

Likewise, in this embodiment, the first transistor T1 can be considered a switch. For example, the first transistor T1 can be a bipolar junction transistor, the first end of the first transistor T1 is a base, the second end of the first transistor T1 is an emitter, and the third end of the first transistor T1 is a collector. As shown in FIG. 5, the first transistor T1 in the bypass circuit 120' works as an emitter follower. For an emitter follower, the output voltage at the emitter of the emitter follower varies with the input voltage of the emitter follower, and a signal output from the emitter of the emitter follower and an input signal of the emitter follower have the same phase. Thus, the bypass circuit 120' can perform with a great linearity even when working under a high power condition. Due to the same reason, the elements in the power amplification circuit can be mainly made of GaAs.

The amplification circuit in this embodiment and the first amplifier circuit 10 in the above embodiments have similar working principles. Under the control of a control signal from the control terminal $V_{MODE1}$, when the bias voltage of the first transistor T1 is within a cutoff region of the first transistor T1, the first transistor T1 is turned off. As the first transistor T1 is turned off, the bypass circuit 120' is an open circuit and the first-stage amplification circuit 110' is enabled. In this case, a signal received via the input end IN of the amplifier 110' is outputted from the output end OUT of the amplifier 110' after being amplified or modulated. On the other hand, when the bias voltage of the first transistor T1 is within an active region of the first transistor T1, the first transistor T1 is turned on. As the first transistor T1 is turned on, compared with the first-stage amplifier 110', the equivalent resistance of the bypass circuit 120' is small and the first-stage amplification circuit 110' is disabled or turned off. In this case, a signal received via the input end IN of the amplifier 110' is directly outputted from the output end OUT of the amplifier 110' without being amplified or modulated.

The amplification circuit in this embodiment can be connected to other amplifiers to form a multi-stage amplification circuit. For example, the amplification circuit in this embodiment can be connected to other two amplifiers in serial to form a three-stage amplification circuit. The bypass circuit 120' can be controlled by the control terminal $V_{MODE1}$ such that the amplification circuit can work in different operation modes. For example, the amplification circuit can be a Dual Mode amplification circuit that can work in a Linear Mode or a Non-Linear Mode. In this example, the bypass circuit 120' can be controlled by the control terminal $V_{MODE1}$ such that the amplification circuit can work as a two-stage amplification circuit or a three-stage amplification circuit. Therefore, the two-stage amplification circuit could work in a linear mode and the three-stage amplification circuit could work in a non-linear mode.

It should be noted that, in this embodiment, the first transistor T1 can be replaced by a FET. In this case, the first end of the first transistor T1 is a gate, the second end of the first transistor T1 is a source, and the third end of the first transistor T1 is a drain. The first transistor T1 in the bypass circuit 120' works as a source follower. Since the voltage gain of the source follower is about 1, the bypass circuit 120' can perform with a great linearity even when working under a high power condition. Due to the same reason, the elements in the power amplification circuit can be mainly made of GaAs.

To sum up, in the amplification circuit provided by the present disclosure, it is the bypass circuit that makes the amplification circuit able to alternatively work in a linear mode or in a non-linear mode according to the operation requirements of an electronic device.

In addition, in the amplification circuit provided by the present disclosure, due to the circuit design of the bypass circuit, the amplification circuit can normally and stably work in a non-linear mode and is hardly affected by the early effect. Also, due the circuit design of the bypass circuit, the bypass circuit can continue to work normally even when the supply voltage gradually decreases.

Moreover, in the bypass circuit of the amplification circuit provided by the present disclosure, the first transistor (such as a bipolar junction transistor or a FET) works as an emitter follower or a source follower so that the bypass circuit can perform with a great linearity even when working under a high power condition. Due to the same reason, the elements in the amplification circuit provided by the present disclosure can be mainly made of GaAs.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. An amplification circuit, used to modulate signals in different operation modes, comprising:
   a first amplifier circuit, including:
      a first-stage amplifier, having an input end and an output end; and
      a bypass circuit, including a first transistor, wherein a first end of the first transistor is a base or a gate of the first transistor and the first end is coupled to the input end of the first-stage amplifier, a second end of the first transistor is coupled to the output end of the first-stage amplifier, and a third end of the first transistor is configured for coupling to a supply voltage; and
   a second-stage amplifier, connected to the first amplifier circuit to form a multi-stage amplification circuit;
   wherein the first end of the first transistor is further coupled to a first control terminal and is configured to receive a control signal from the first control terminal for controlling a bias voltage of the first transistor such that the amplification circuit works in different operation modes.

2. The amplification circuit according to claim 1, further comprising:
   a third-stage amplifier, connected to the second-stage amplifier to form the multi-stage amplification circuit;
   wherein the amplification circuit is a power amplification circuit, the first-stage amplifier is a first-stage driver amplifier, the second-stage amplifier is a second-stage driver amplifier, and the third-stage amplifier is a third-stage power amplifier.

3. The amplification circuit according to claim 1, further comprising:
   a bias circuit, including at least one first bias resistor;
   wherein one end of the first bias resistor is coupled to the first end of the first transistor, and another end of the first bias resistor is coupled to the first control terminal.

4. The amplification circuit according to claim 1, wherein according to the control signal, when the bias voltage of the first transistor is within a cutoff region of the first transistor, the first transistor is turned off such that the amplification circuit works in a non-linear operation mode.

5. The amplification circuit according to claim 1, wherein according to the control signal, when the bias voltage of the first transistor is within an active region or a saturation region of the first transistor, the first transistor is turned on such that the power amplification circuit works in a linear operation mode.

6. The amplification circuit according to claim 3,
   wherein the bypass circuit further includes a second transistor, a third transistor, a first resistor, a first capacitor and a second capacitor;
   wherein the first capacitor is coupled between the first end of the first transistor and the input end of the first-stage amplifier, the second capacitor is coupled between the second end of the first transistor and the output end of the first-stage amplifier, a first end of the second transistor is coupled to a first end of the third transistor, a third end of the second transistor is coupled between the first bias resistor and the first control terminal through the first resistor, a third end of the third transistor is coupled between the second end of the first transistor and the second capacitor, the first end of the second transistor and the third end of the second transistor are coupled together, and a second end of the second transistor and a second end of third transistor are both configured for coupling to a reference voltage.

7. The amplification circuit according to claim 6, wherein the bypass circuit further includes a fourth transistor, a first end of the fourth transistor and a third end of the fourth transistor are coupled together and further coupled between the first bias resistor and the first control terminal through the first resistor, and a second end of the fourth transistor is coupled to the first end of the second transistor and the third end of the second transistor.

8. The amplification circuit according to claim 7, wherein the first transistor, the second transistor, the third transistor and the fourth transistor are bipolar junction transistors, the first ends of the second transistor, the third transistor and the fourth transistor are bases, the second ends of the first transistor, the second transistor, the third transistor and the fourth transistor are emitters, and the third ends of the first transistor, the second transistor, the third transistor and the fourth transistor are collectors.

9. The amplification circuit according to claim 7, wherein the first transistor, the second transistor, the third transistor and the fourth transistor are FETs, the first ends of the second transistor, the third transistor and the fourth transistor are gates, the second ends of the first transistor, the second transistor, the third transistor and the fourth transistor are sources, and the third ends of the first transistor, the second transistor, the third transistor and the fourth transistor are drains.

10. The amplification circuit according to claim 3, wherein the bypass circuit further includes:
    a second transistor, a third transistor, a first capacitor and a second capacitor, wherein the first capacitor is coupled between the first end of the first transistor and the input end of the first-stage amplifier, the second capacitor is coupled between the second end of the first transistor and the output end of the first-stage amplifier, a first end of the second transistor and a first end of the third transistor are coupled together, a third end of the third transistor is coupled between the second end of the first transistor and the second capacitor, and a second end of the second transistor and a second end of the third transistor are both configured for coupling to a reference voltage;
    a fourth transistor, wherein a first end of the fourth transistor is coupled to the first end of the first transistor and the first capacitor through the first bias resistor, a second end of the fourth transistor is coupled to the third end of the second transistor, and a third end of the fourth transistor is coupled to the first end of the second transistor; and
    a fifth transistor, wherein a first end of the fifth transistor and a third end of the fifth transistor are coupled together and further coupled to the first end of the fourth transistor;
    wherein the third end of the fourth transistor is coupled to the first control terminal and configured to receive the control signal, and the third end of the fifth transistor is coupled to a second control terminal to receive another control signal.

11. The amplification circuit according to claim 10, wherein the first control terminal and the second control terminal are the same control terminal.

12. The amplification circuit according to claim 10, wherein the first transistor, the second transistor, the third transistor, the fourth transistor and the fifth transistor are bipolar junction transistors, the first ends of the second transistor, the third transistor, the fourth transistor and the fifth transistor are bases, the second ends of the first transistor, the second transistor, the third transistor, the fourth transistor and the fifth transistor are emitters, and the third ends of the first transistor, the second transistor, the third transistor, the fourth transistor and the fifth transistor are collectors.

13. The amplification circuit according to claim 10, wherein the first transistor, the second transistor, the third transistor, the fourth transistor and the fifth transistor are FETs, the first ends of the second transistor, the third transistor, the fourth transistor and the fifth transistor are gates, the second ends of the first transistor, the second transistor, the third transistor, the fourth transistor and the fifth transistor are sources, and the third ends of the first transistor, the second transistor, the third transistor, the fourth transistor and the fifth transistor are drains.

14. An amplification circuit, comprising:
    an amplifier, having an input end and an output end; and
    a bypass circuit, including a first transistor, wherein a first end of the first transistor is a base or a gate of the first transistor and the first end is coupled to the input end of the amplifier, a second end of the first transistor is coupled to the output end of the amplifier, and a third end of the first transistor is configured for coupling to a supply voltage;
    wherein the first end of the first transistor is further configured for coupling to a control terminal to receive a control signal from the control terminal for controlling a bias voltage of the first transistor, such that the first transistor is turned off or turned on.

15. The amplification circuit according to claim 14, wherein the amplification circuit is a power amplification circuit, the amplifier is a driver amplifier, the bypass circuit further includes a bias circuit, the bias circuit includes at least one first bias resistor, one end of the first bias resistor is coupled to the first end of the first transistor, and another end of the first bias resistor is coupled to the control terminal.

16. The amplification circuit according to claim 14, wherein according to the control signal, when the bias voltage of the first transistor is within a cutoff region of the first transistor, the first transistor is turned off, such that a signal received via the input end of the amplifier is outputted from the output end of the amplifier after being modulated.

17. The amplification circuit according to claim 14, wherein according to the control signal, when the bias voltage of the first transistor is within an active region or a saturation region of the first transistor, the first transistor is turned off, such that a signal received via the input end of the amplifier is directly output from the output end of the amplifier through the bypass circuit without being modulated.

18. The amplification circuit according to claim 14, wherein the first transistor is a bipolar junction transistor, the first end of the first transistor is the base, the second end of the first transistor is an emitter and the third end of the first transistor is a collector.

19. The amplification circuit according to claim 14, wherein the first transistor is a FET, the first end of the first transistor is the gate, the second end of the first transistor is a source and the third end of the first transistor is a drain.

\* \* \* \* \*